United States Patent
Hu et al.

(10) Patent No.: US 7,859,089 B2
(45) Date of Patent: Dec. 28, 2010

(54) COPPER STRAPS

(75) Inventors: Kunzhong Hu, Santa Monica, CA (US); Chuan Cheah, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 478 days.

(21) Appl. No.: 11/800,125

(22) Filed: May 4, 2007

(65) Prior Publication Data

US 2007/0267727 A1 Nov. 22, 2007

Related U.S. Application Data

(60) Provisional application No. 60/797,768, filed on May 4, 2006.

(51) Int. Cl.
*H01L 23/485* (2006.01)
(52) U.S. Cl. .................. 257/669; 257/666; 257/673; 257/E23.039
(58) Field of Classification Search .............. 257/666, 257/672, 673, 669, E23.039
See application file for complete search history.

(56) References Cited

U.S. PATENT DOCUMENTS

| | | | | |
|---|---|---|---|---|
| 4,935,803 A * | 6/1990 | Kalfus et al. | ................. | 257/673 |
| 6,459,147 B1 * | 10/2002 | Crowley et al. | ............. | 257/692 |
| 6,521,982 B1 * | 2/2003 | Crowley et al. | ............. | 257/676 |
| 6,545,349 B2 * | 4/2003 | Iwaya et al. | ................. | 257/696 |
| 6,630,726 B1 * | 10/2003 | Crowley et al. | ............. | 257/666 |
| 6,849,930 B2 * | 2/2005 | Nakajima et al. | ........... | 257/666 |
| 7,081,666 B2 * | 7/2006 | Joshi et al. | .................. | 257/666 |
| 7,683,434 B2 * | 3/2010 | Agnello et al. | ............. | 257/384 |
| 2005/0133893 A1 * | 6/2005 | Joshi et al. | .................. | 257/676 |
| 2007/0290336 A1 * | 12/2007 | Sun et al. | ..................... | 257/735 |

* cited by examiner

*Primary Examiner*—Nitin Parekh
(74) *Attorney, Agent, or Firm*—Farjami & Farjami LLP

(57) ABSTRACT

A copper strap for a semiconductor device package having a contact electrically connected to a die electrode, a leg portion electrically connected to a lead frame, a web portion positioned between the contact and the leg portion and connected to the leg portion and a connection region connecting the web portion to the contact. The contact includes a body having a plurality of formations, each of the plurality of formations having a concavity and an opposing convexity positioned to generally face the die electrode.

22 Claims, 9 Drawing Sheets

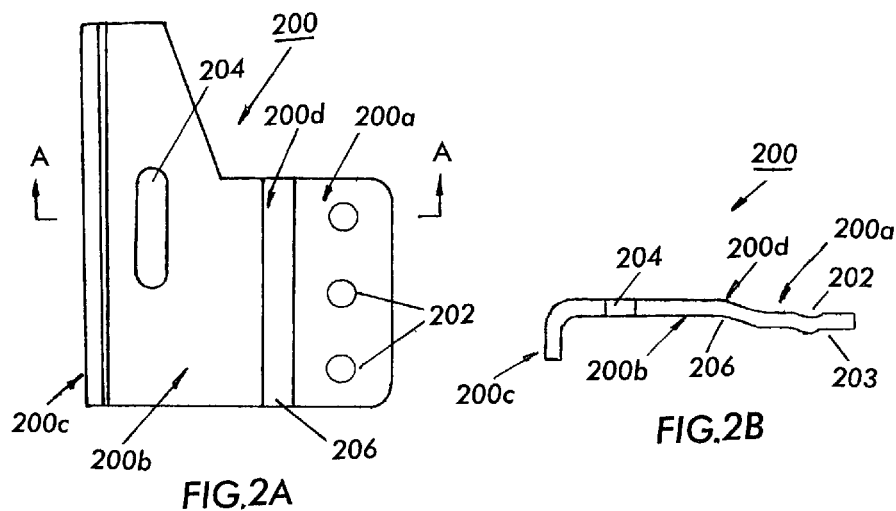
FIG.2A
FIG.2B
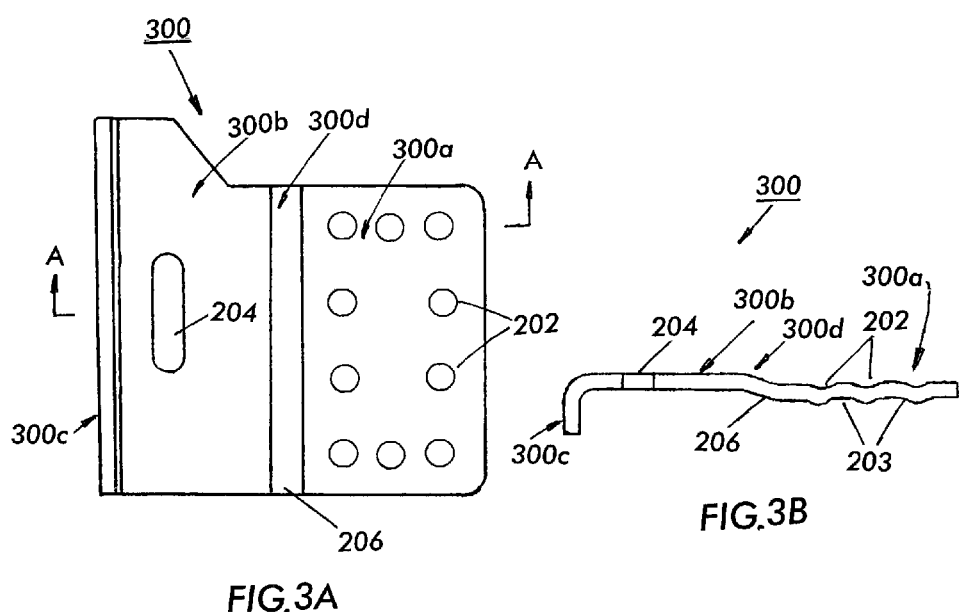
FIG.3A
FIG.3B

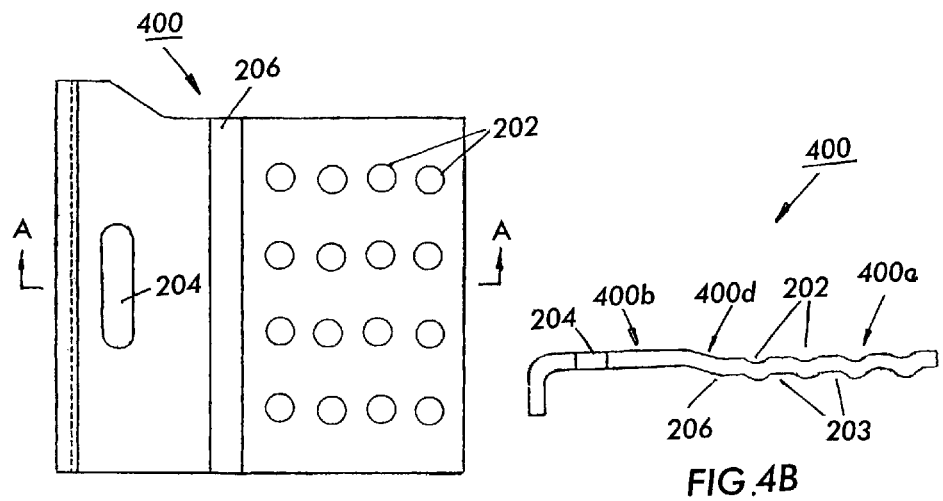
FIG.4A
FIG.4B
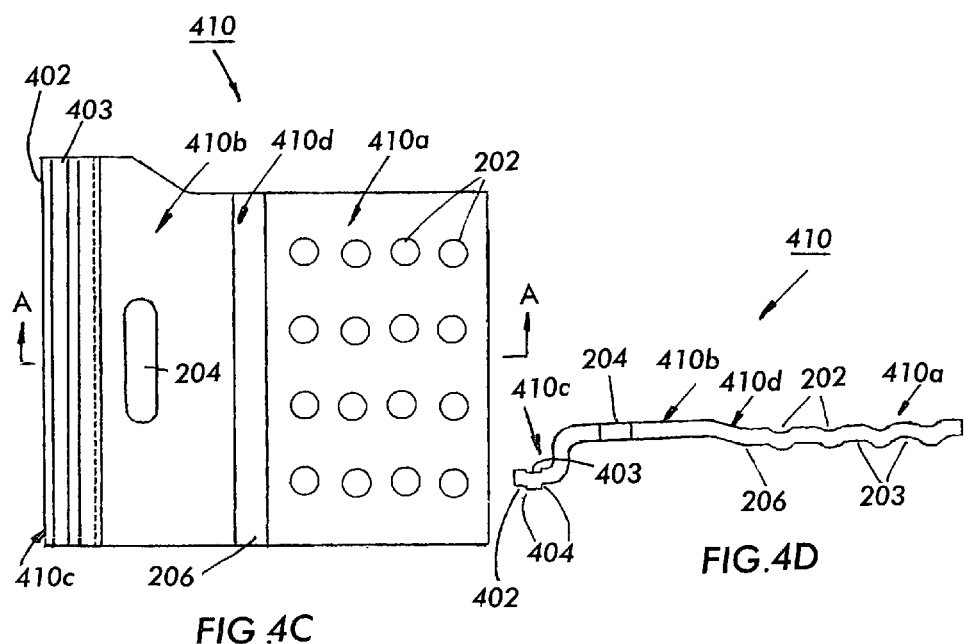
FIG.4C
FIG.4D

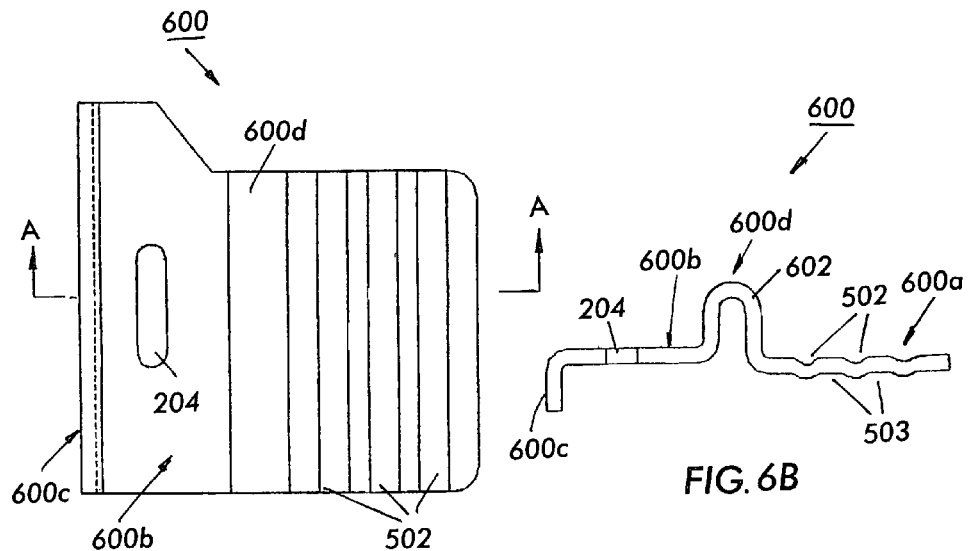
FIG. 6A
FIG. 6B
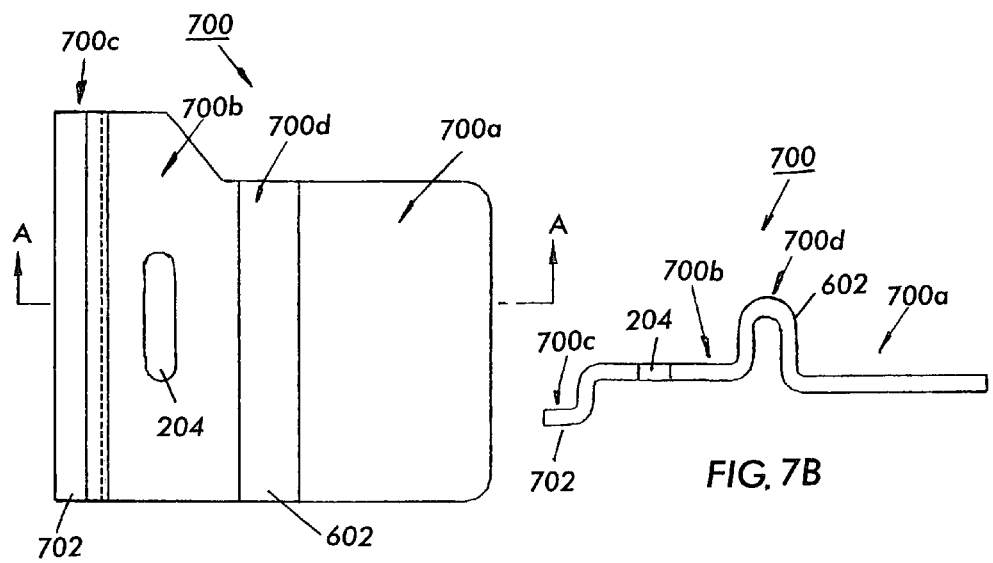
FIG. 7A
FIG. 7B

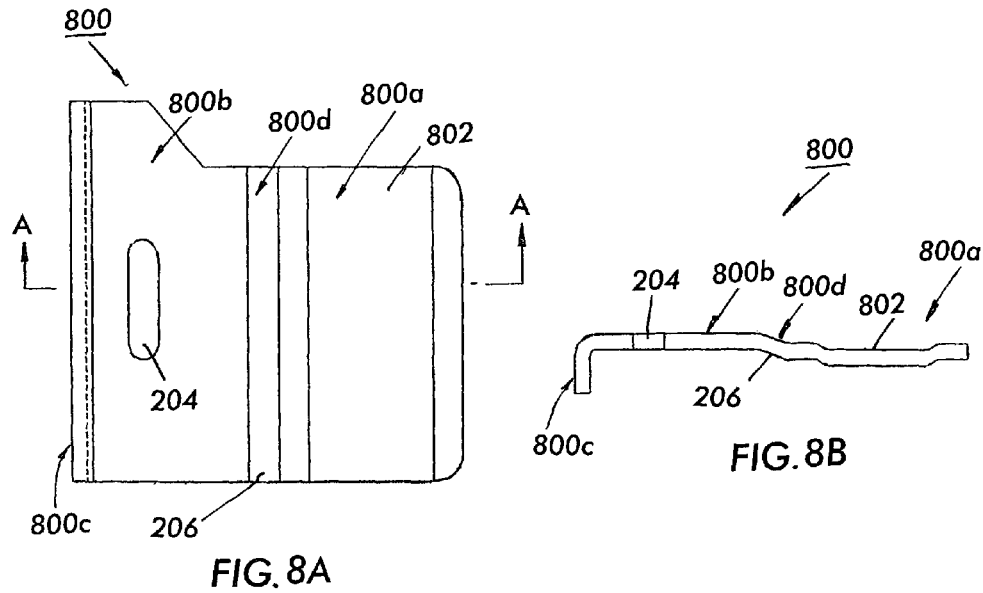
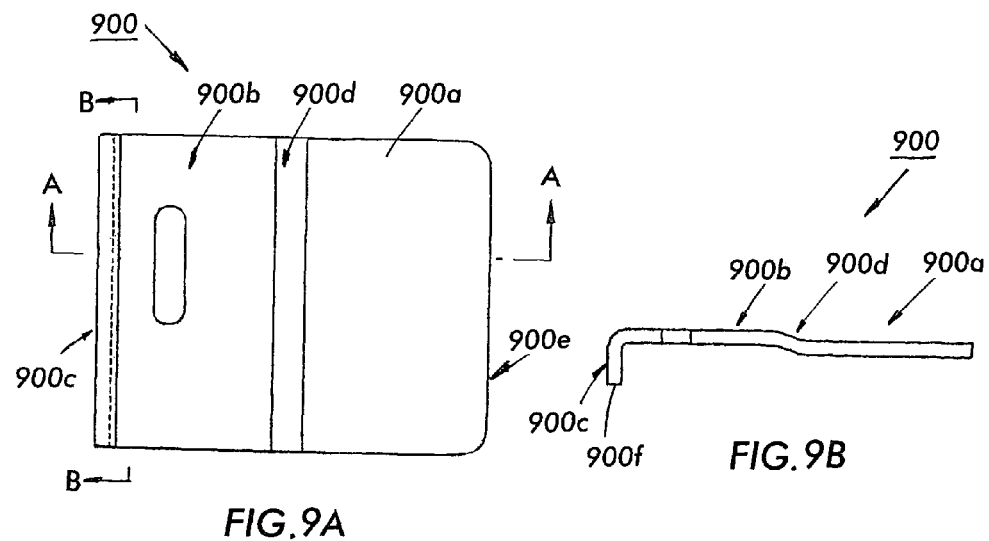
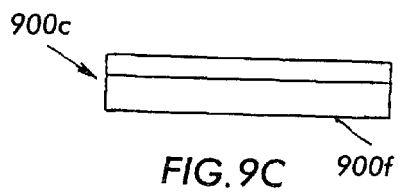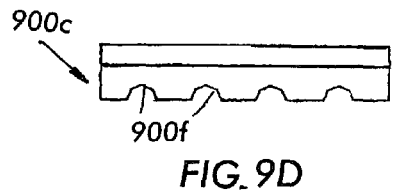

STEP 1, SOLDER DISPENSE, Q1 FET SMT.

STEP 2, SOLDER DISPENSE ON TOP OF Q1 FET AND SOURCE PINS.

STEP 3, COPPER STRAP PLACEMENT AND REFLOW.
(ALL UNITS ARE IN MILS)

STEP 4, WIRE BOND.

STEP 5, MOLDING AND SINGULATION

COPPER STRAPS

CROSS-REFERENCE TO RELATED APPLICATIONS

This application claims all rights of priority under 35 U.S.C. §119(e) to U.S. Provisional Patent Application Ser. No. 60/797,768 filed May 4, 2006. The disclosure of which is incorporated by reference.

FIELD OF THE INVENTION

This invention relates to semiconductor device packages that use copper straps to interface to device electrodes and more specifically, relates to improved forms of copper straps for such device packages.

BACKGROUND OF THE INVENTION

Semiconductor die, such as vertical conduction power switching die like MOSFETs, have been packaged as SO8 device packages using wirebonds. For example, in the case of a vertical conduction power MOSFET having a drain electrode on one surface of the die and source and gate electrodes on an opposing surface of the die, an SO8 device package may have the drain electrode directly attached through a conductive adhesive to a die pad of the package lead frame, which die pad may be integral with one or more terminal leads. In turn, the source and gate electrodes on the top surface of the die may be electrically connected through wirebonds to one or more respective terminal leads. Notably, it has been found that the wirebonds that connect the source electrode to the package terminal leads increase the resistance of the overall device package.

To reduce this package resistance, wirebonded SO8 device packages described above are being gradually replaced with device packages that use a copper strap to electrically connect the source electrode to the terminal leads. Such copper strap device packages have taken various forms, including SO8, MLP and QFN device packages.

A known SO8 device package 100 is shown in FIGS 1A and 1B. It should be noted that the device package shown in FIG. 1A has protective housing 114 removed. Device package 100 has a lead frame that includes a die pad 118 and a plurality of terminal leads 120-127. As shown, terminal leads 124-127 are integral with die pad 118 and terminal leads 120-122 are integral with one another. Device package 100 also includes a power switching die 102, such as a power MOSFET, having a source electrode 104 and gate electrode 106 on a top surface thereof and a drain electrode 108 on a bottom surface thereof. While source electrode 104 is shown as a single electrode, it may also be formed as two or more electrodes.

Similarly to the wirebonded SO8 device package described above, die 102 is mounted within package 100 such that drain electrode 108 is directly attached through a conductive adhesive, such as solder or conductive epoxy, to die pad 118. Similarly, gate electrode 106 is electrically connected through wirebond 112 to the bond pad of terminal lead 123. However, rather than connecting source electrode 104 through wirebonds to the terminal leads, source electrode 104 is now connected through a copper strap or copper clip 110 to the bond pad of terminal leads 120-122. Device package 100 also includes protective housing 114 formed of a moulding compound that covers at least copper strap 110, die 102, and a portion of the lead frame.

In general, it has been found that device packages (e.g., the SO8, MLP and QFN packages) using a copper strap to electrically connect the source electrode to the terminal leads have a lower package resistance than wirebonded SO8 device packages. In addition, the packaging costs of the copper strap device packages also have packaging costs that are not more than the wirebonded SO8 device package. Accordingly, the copper strap device packages are becoming increasingly popular and are being used to gradually replace the wirebonded SO8 device package.

As shown in FIGS. 1A and 1B, the copper straps, such as strap 110, used in the copper strap device packages generally include a contact 110a that is electrically connected through a conductive adhesive, such as solder or conductive epoxy, to the die electrode, include a leg 110c that is electrically connected through a conductive adhesive to the lead frame, and include a web 110b that connects the contact to the leg. In general, among other features, it is desirable to improve the solder joints between the die electrode and contact 110a and between the lead frame and leg 110c, thereby improving copper strap device packages, such as copper strap SO8, MLP, and QFN device packages.

BRIEF SUMMARY OF THE INVENTION

According to an embodiment of the invention, the contact of a copper strap may include a plurality of formations, such as dimples or grooves, formed in the top surface thereof and that extend outward from the underside of the contact, thereby forming pockets on the underside of the contact. The formations and pockets provide for better control of the solder joint between the contact and a die electrode(s) and for an improved connection between the contact and the die electrode(s). According to another embodiment of the invention, a large ingression may be formed in the top surface of the contact and that extends outward from the underside of the contact. According to a further embodiment of the invention, the contact may be formed as a flat large area contact.

According to an embodiment of the invention, a connection region may join the web and contact of a strap. This connection region may be formed as a slanted extension or a curved extension that may cause the web to lie higher than a die surface to which the contact is connected. The slanted and curved extensions provide for stress release and improved solder fatigue at the connection of the contact and leg to a die electrode(s) and package lead frame, respectively.

According to another embodiment of the invention, one or more through holes may be formed in the web of the strap. These through holes improve the flow of the molding compound of the device package.

According to a further embodiment of the invention, the leg of a strap may include a horizontal extension that forms a large area contact between the leg and a lead frame. According to another embodiment of the invention, one or more grooves may be formed in the top surface of the extension that extend outward from the underside of the extension, thereby forming on this underside a plurality of pockets. The groove and pockets provide for better control of the solder joint and for an improved connection between the leg and lead frame.

Other features and advantages of the present invention will become apparent from the following description of the invention, which refers to the accompanying drawings.

BRIEF DESCRIPTION OF THE DRAWINGS

FIGS. 2A and 2B show a top view and a side view of a copper strap according to an embodiment of the invention, FIG. 2B being seen along line A-A of FIG. 2A.

FIGS. 3A and 3B show a top view and a side view of a copper strap according to an embodiment of the invention, FIG. 3B being seen along line A-A of FIG. 3A.

FIGS. 4A and 4B show a top view and a side view of a copper strap according to an embodiment of the invention, FIG. 4B being seen along line A-A of FIG. 4A.

FIGS. 4C and 4D show a top view and a side view of a copper strap according to an embodiment of the invention, FIG. 4D being seen along line A-A of FIG. 4C.

FIGS. 6A and 6B show a top view and a side view of a copper strap according to an embodiment of the invention, FIG. 6B being seen along line A-A of FIG. 6A.

FIGS. 7A and 7B show a top view and a side view of a copper strap according to an embodiment of the invention, FIG. 7B being seen along line A-A of FIG. 7A.

FIGS. 8A and 8B show a top view and a side view of a copper strap according to an embodiment of the invention, FIG. 8B being seen along line A-A of FIG. 8A.

FIGS. 9A and 9B show a top view and a side view of a copper strap according to an embodiment of the invention, FIG. 9B being seen along line A-A of FIG. 9A.

FIG. 9C shows a front view of the copper strap of FIGS. 9A and 9B according to an embodiment of the invention, FIG. 9C being seen along line B-B of FIG. 9A.

FIG. 9D shows a front view of the strap of FIGS. 9A and 9B according to another embodiment of the invention, FIG. 9D being seen along line B-B of FIG. 9A.

DETAIL DESCRIPTION OF THE INVENTION

Figure 1A:
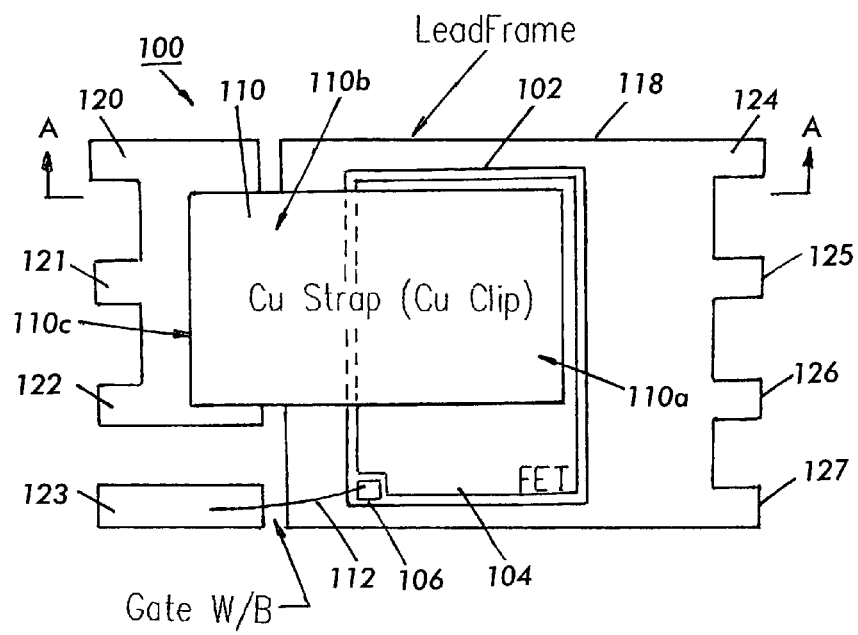
FIGS. 1A and 1B show a top view and a side view of a semiconductor device package of the prior art, FIG. 1B being seen along line A-A of FIG. 1A.
Figure 1B:
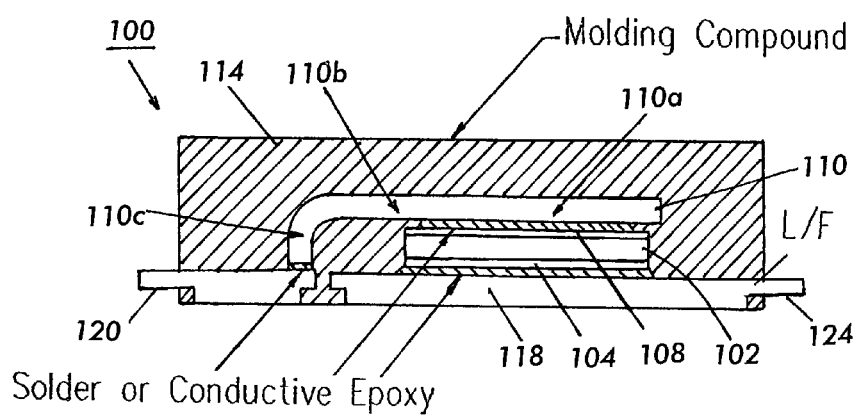

Referring to FIGS. 2A and 2B, there is shown a copper strap 200 according to an embodiment of the invention. Copper strap 200, in addition to the other copper straps of the present invention as described below, may be used in copper strap SO8, MLP, and QFN device packages and in particular, may be used in place of strap 110 to connect the source electrode(s) of a vertical conduction power MOSFET to the lead frame of such device packages, as described above for device package 100. Nonetheless, one skilled in the art will recognize that the copper straps of the present invention may be used in other package formats and may be used to connect the electrode(s) of semiconductor die other than power MOSFETs to a device package lead frame.

In addition, in the case of a power switching die, rather than being used to connect the source electrode to the package lead frame, copper straps of the present invention may also be used to connect the drain electrode to the lead frame. In particular, U.S. Provisional Patent Application entitled "DISCRETE COPPER STRAP DEVICE PACKAGES HAVING NO WIREBONDS", by the inventors of the present application and co-filed with the present application, discloses a device package in which the source and gate electrodes of a vertical conduction power switching die are flip-chip mounted to the package lead frame and the drain electrode on an opposing die surface is connected through a copper strap to the lead frame. Any one of the copper straps of the present invention may be used to form the drain electrode-to-lead frame connection as disclosed in that application. The contents of U.S. Provisional Patent Application entitled "DISCRETE COPPER STRAP DEVICE PACKAGES HAVING NO WIREBONDS", are hereby incorporated by reference.

Referring again to FIGS. 2A and 2B, according to an embodiment of the invention, copper strap 200 may include a plurality of "dimples" 202 formed in the top surface of contact 200a and that extend outward from the underside of the contact, thereby forming on this underside a plurality of "dimpled pockets" 203 between dimples 202. Dimples 202 and pockets 203 provide for better control of the solder joint between contact 200a and a die electrode(s) and for an improved connection between contact 200a and the die electrode(s). Each dimple 202 preferably has a diameter of 0.24 mm. One skilled in the art will recognize that the dimples and pockets formed on the underside of contact 200a may be formed in other ways without deviating from the present invention. As shown in FIG. 2A, the contact may have the width of approximately 0.6 mm and the height of approximately 1.8 mm.

According to another aspect of this embodiment of the invention and as shown in FIG. 2B, a connection region 200d may join web 200b to contact 200a of strap 200. This connection region may be formed as a slanted extension 206 that slants upward such that web 200b lies higher than the die surface to which contact 200a is connected. Such a slanted configuration of connection region 200d provides for stress release and improved solder fatigue at the connection of contact 200a and leg 200c to a die electrode(s) and a package lead frame, respectively. In the preferred embodiment of FIGS. 2A and 2B, the connection region has a width of approximately 0.25 mm and is inclined at an angle of approximately 20°.

According to another aspect of this embodiment of the invention, strap 200 may include one or more holes/openings, such as hole 204, formed through web 200b. These through holes improve the flow of the molding compound 114. The shape of the through holes may be rectangular, round, oval, or any other reasonable shape.

According to a further aspect of this embodiment of the invention, strap 200 may include a simple shape for leg 200c, as shown in FIG. 2B.

According to an embodiment of the invention, strap 200, in addition to the other straps of the present invention as described below, may be formed of OFHC copper. Nonetheless, other suitable materials, in addition to materials other than copper, may be used.

One skilled in the art will recognize that strap 200 does not need to include each of the above-described features and other features/combinations of features are possible without deviating from the present invention. For example, rather than the surface of contact 200a having dimples 202 and pockets 203, this surface may be flat. Similarly, rather than connection region 200d being formed as a slanted extension 206, connection region 200d may also be flat such that web 200b is essentially in line with a die surface. Strap 200 also does not need to include through holes 204. One skilled in the art will also recognize that strap 200 may have irregular shapes other than that shown in FIG. 2A, or may have regular shapes, such as a rectangular shape. In addition, strap 200 may be formed in different sizes.

Referring now to FIGS. 3A and 3B, in which like reference numerals refer to similar elements, there is shown a copper strap 300 according to another embodiment of the invention. Strap 300 is similar to strap 200 but is of a larger size, thereby having, for example, a larger number dimples 202 and pockets 203 formed in the surface of contact 300a. Specifically, contact 300a has a preferred width of 1.8 mm or greater and the height of 2.5 mm or greater.

In addition to dimples and pockets, strap 300 may also include a connection region 300d formed as a slanted extension 206, may include one or more through holes 204 formed in web 300b, and may include a simple shape for leg 300c, as shown in FIG. 3B. Again, other combinations of features, shapes, and sizes for strap 300 are possible, as similarly described for strap 200.

According to an embodiment of the invention, various sizes of strap 200 and strap 300 as shown in FIGS. 2A and 2B and FIGS. 3A and 3B may be used with a full range of control FETs and sync FETs.

Referring now to FIGS. 4A and 4B, there is shown a copper strap 400 according to another embodiment of the invention. Strap 400 is similar to straps 200 and 300, for example, but has a different shape and a different configuration of dimples 202 and pockets 203 formed in the surface of contact 400a. Again, other combinations of features, shapes, and sizes for strap 400 are possible, as similarly described for straps 200 and 300.

Referring now to FIGS. 4C and 4D, there is shown a copper strap 410 according to another embodiment of the invention. Strap 410 is similar to straps 200, 300, and 400, for example, having a contact 410a, web 410b, and connection region 410d that have features as described above. According to this embodiment of the invention, however, leg 410c may include a horizontal extension 402 that forms a large area contact between leg 410c and a lead frame. The horizontal extension 402 preferably has a width of approximately 0.3 mm. In addition, according to this embodiment of the invention, one or more grooves, such as groove 403, may be formed in the top surface of extension 402 and that extend outward from the underside of the extension, thereby forming on this underside a plurality of "grooved pockets" 404. Groove 403 and pockets 404 provide for better control of the solder joint and for an improved connection between leg 410c and a lead frame.

Again, other combinations of features, shapes, and sizes for strap 410 are possible, as similarly described above, including a flat contact 410a, a flat connection region 410d, and/or no through hole 204.

Figures 5A, 5B:
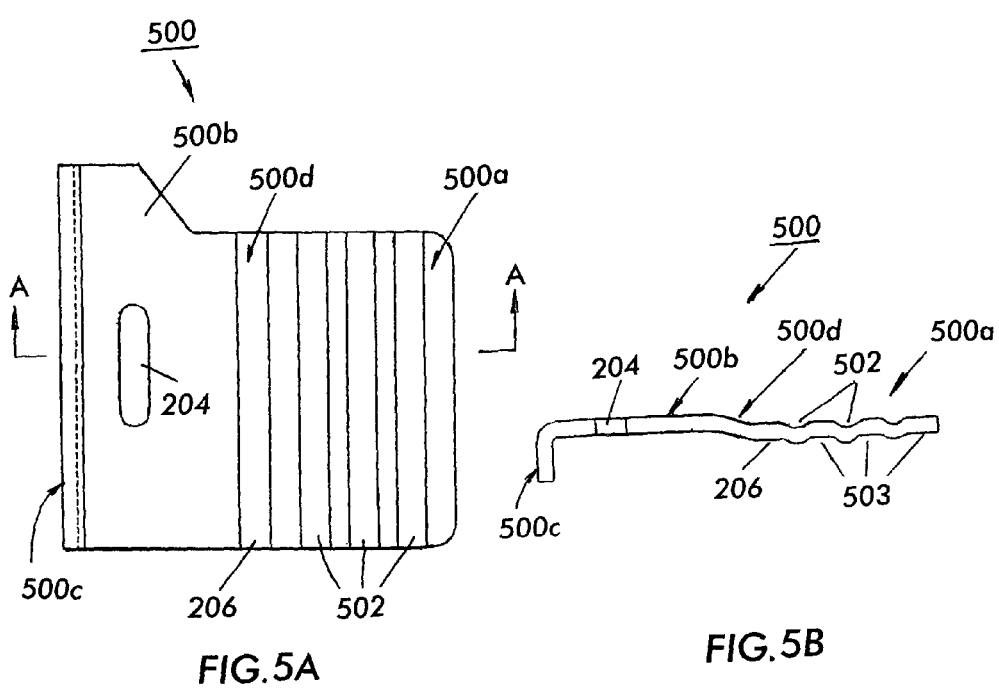
FIGS. 5A and 5B show a top view and a side view of a copper strap according to an embodiment of the invention, FIG. 5B being seen along line A-A of FIG. 5A.

Referring now to FIGS. 5A and 5B, there is shown a copper strap 500 according to another embodiment of the invention. According to this embodiment of the invention, copper strap 500 may include one or more "grooves" 502 formed in the top surface of contact 500a and that extend outward from the underside of the contact, thereby forming on this underside a plurality of "grooved pockets" 503 between grooves 502. Similar to dimples 202 and pockets 203, grooves 502 and pockets 503 provide for better control of the solder joint between contact 500a and a die electrode(s) and for an improved connection between contact 500a and the die electrode(s).

Similar to the above described straps, strap 500 may also include a connection region 500d formed as a slanted extension 206 and may include one or more through holes 204 formed in web 500b, although again, connection region 500d may alternatively be flat and web 500b may not have any through holes. In addition, while strap 500 is shown with a simple shape for leg 500c, strap 500 may alternatively have a leg similar to that of strap 410. Again, other combinations of features, shapes, and/or sizes for strap 500 are possible as described above.

Referring now to FIGS. 6A and 6B, there is shown a copper strap 600 according to another embodiment of the invention. Strap 600 is similar to strap 500. According to this embodiment of the invention, however, connection region 600d may be formed as a curved extension 602. As shown in FIG. 6B, extension 602 may be formed to also cause web 600b to lie higher than a die surface to which contact 600a is connected. Similar to slanted extension 206, curved extension 602 provides for stress release and improved solder fatigue at the connection of contact 600a and leg 600c to a die electrode(s) and a package lead frame, respectively.

While strap 600 is shown as having a contact 600a that includes a plurality of grooves 502 and pockets 503, contact 600a may alternatively include a plurality of dimples 202 and pockets 203, or may be flat. Similarly, while strap 600 is shown as having a through hole 204 and a simple shape for leg 500c, strap 600 may alternatively have no through hole and may include a leg 600c similar to that of strap 410. Again, other combinations of features, sizes, and/or shapes for strap 600 are possible.

Referring now to FIGS. 7A and 7B, there is shown a copper strap 700 according to another embodiment of the invention. According to this embodiment of the invention, contact 700a may be formed as a large flat surface, thereby forming a large area contact between contact 700a and a die electrode. In addition, according to this embodiment of the invention, leg 700c may include a horizontal extension 702 that forms a large area contact between leg 700c and a lead frame. According to another embodiment of the invention, one or more grooves may also be formed in extension 702, similar to strap 410.

While strap 700 is shown as having a connection region 700d formed as a curved extension 602, this region may alternatively by formed as a slanted extension 206 or may be flat. Similarly, while strap 700 is shown as having a through hole 204, strap 700 may alternatively have no through hole. Again, other combinations of features, sizes, and/or shapes for strap 700 are possible.

Referring now to FIGS. 8A and 8B, there is shown a copper strap 800 according to another embodiment of the invention. As shown in the Figures, copper strap 800 may include a large ingression 802 formed in the top surface of contact 800a and that extends outward from the underside of the contact.

As shown, strap 800 may also include a connection region 800d formed as a slanted extension 206, although this region may alternatively be formed as a curved extension 602 or may be flat. Similarly, strap 800 may include one or more through holes 204, although again, these through holes are not required. As further shown in the Figures, strap 800 may include a simple shape for leg 800c, although this leg may alternatively be formed as shown for straps 410 or 700, for example. Again, other combinations of features, sizes, and/or shapes for strap 800 are possible.

In general, a strap according to the present invention may have any combination of the above described features of straps 200-800. For example, referring to FIGS. 9A and 9B, there is shown a copper strap 900 according to an embodiment of the invention. In general, a strap of the present invention may be formed to have different shapes, as seen from the top of the strap. For example, the strap may have an irregular shape, or may have a regular shape, such as a rectangular shape as shown in FIG. 9A. The edge 900e may be straight or curved.

As for contact 900a, the surface of this area may be flat, may have dimples 202 and dimpled pockets 203, may have grooves 502 and grooved pockets 503, may have an ingression 802, and/or may have any combination of these features.

As for connection region 900d, this region may be flat, may be formed as a slanted extension 206, or may be formed as a curved extension 602.

As for web 900b, this region may have one or more through holes 204 formed therein. When present, these holes may have various shapes including rectangular, round, oval, or any other reasonable shape.

As for leg extension 900c, it may have a simple shape, as shown in FIGS. 9A and 9B. Note that the bottom surface 900f of the leg may be flat, as shown in FIG. 9C. According to another embodiment of the invention, bottom surface 900f may be curved, as shown in FIG. 9D. As a further alternative, leg 900c may have a form as shown for straps 410 or 700.

Referring now to FIGS. 10A-10E, there is shown a process according to an embodiment of the invention for assembling a device package that includes a copper strap of any of the above embodiments. Note that while FIGS. 10A-10E show an SO8 device package 1000 having a power MOSFET 1002 and a generic copper strap 1010 connected between the source electrodes 1004 of the MOSFET and the package lead frame. One skilled in the art will recognize that the present invention is not limited to SO8 device packages and is not limited to power MOSFETs. Further, the configuration of the copper strap 1010 is shown as generic. A person skilled in the art will recognize that any of the above described embodiments of the copper strap may be utilized in the device package shown in FIGS. 10A-10D. In addition, as shown in the Figures, device package 1000 has a lead frame that includes a die pad 1018 and a plurality of terminal leads 1020-1027. Again, the invention is not limited to the lead frame as shown in the Figures.

Figure 10A:
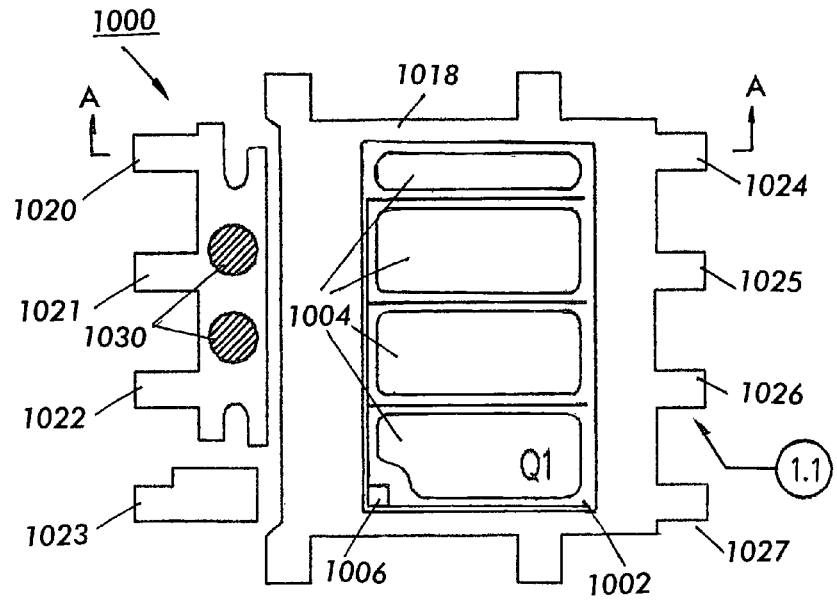
FIGS. 10A-10E show a process for forming a device package using a copper strap according to an embodiment of the invention.
Figure 10B:
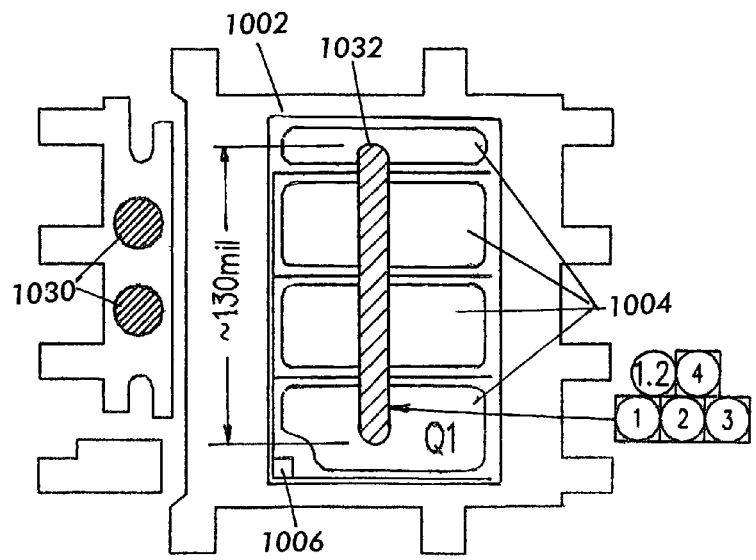
Figure 10C:
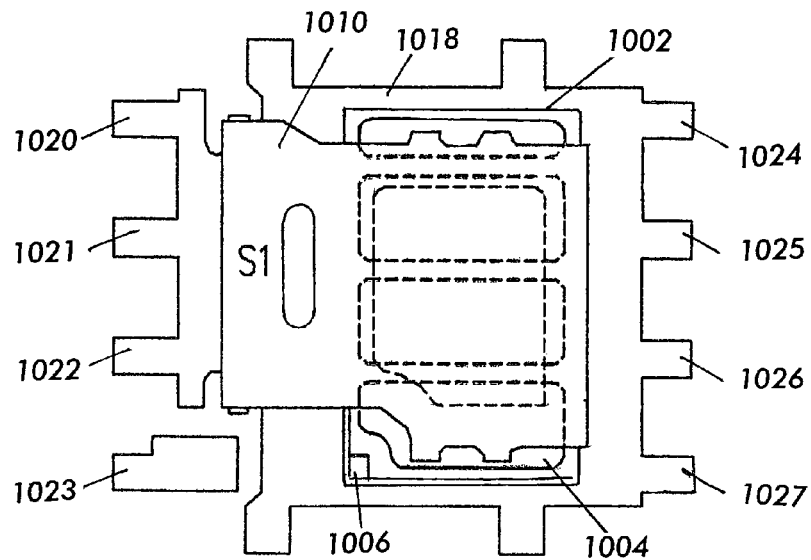
Figure 10D:
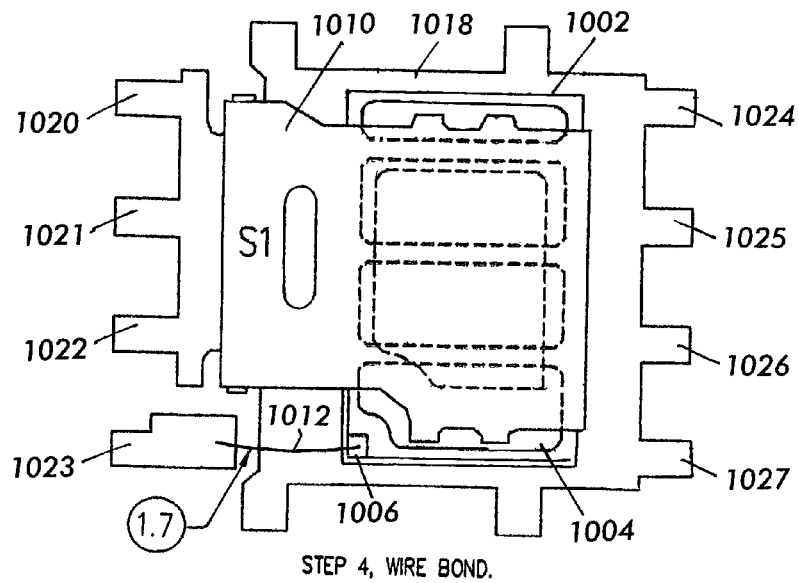
Figure 10E:
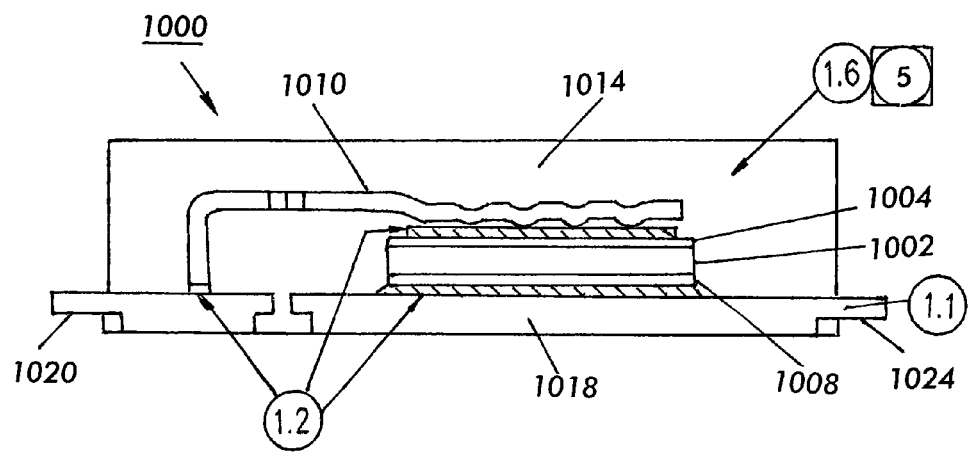

Beginning with FIG. 10A, power MOSFET 1002 is first surface mounted to die pad 1018 such that drain electrode 1008 of the die contacts the pad. Solder 1030 is also dispensed onto the bond pad of terminal leads 1020-1022, which are to receive the leg 1010c of copper strap 1010. Referring next to FIG. 10B, a strip of solder 1032 is preferably dispensed onto the top surface of MOSFET 1002 and is spread over the source electrodes 1004. A conventional method of placing dots of solder onto the source electrodes may also be used. It should be noted that solder 1030 and solder 1032 may be dispensed at the same time. As shown in FIG. 10C, copper strap 1010 is next placed atop the source electrodes 1004 of MOSFET 1002 and the bond pad of terminal leads 1020-1027, and the solder is then reflown. Conductive epoxy may be used in this process as a solder's substitute. Next, a wire bond 1012 is formed from gate electrode 1006 of MOSFET 1002 to the bond pad of terminal lead 1023. Finally, as shown in FIG. 10E, which is a side view of the device package as seen along line A-A of FIG. 10A, molding compound 1014 is formed over MOSFET 1002, strap 1010, and a portion of the lead frame. The device package is then singulated.

For the convenience of the reader, the above description has focused on a representative sample of all possible embodiments, a sample that teaches the principles of the invention and conveys the best mode contemplated for carrying it out. The description has not attempted to exhaustively enumerate all possible variations. Other undescribed variations or modifications may be possible. For example, where multiple alternative embodiments are described, in many cases it will be possible to combine elements of different embodiments, or to combine elements of the embodiments described here with other modifications or variations that are not expressly described. Many of those undescribed variations, modifications and variations are within the literal scope of the following claims, and others are equivalent.

What is claimed is:

1. A copper strap for a semiconductor device package comprising:
    a contact electrically connectable to a die electrode, the contact including a plurality of formations in the body thereof, each of the plurality of formations having a concavity and an opposing convexity positioned to generally face the electrode;
    a leg portion electrically connected to a lead frame;
    a web portion positioned between the contact and the leg portion and connected to the leg portion; and
    a connection region connecting the web to the contact.

2. The copper strap according to claim 1, wherein the web portion further comprises a through hole configured to allow flow of a molding compound therethrough.

3. The copper strap according to claim 1, wherein the each formation is a generally round depression.

4. The copper strap according to claim 1, wherein the each formation is an elongated groove extending from one edge of the contact to another edge thereof.

5. The copper strap according to claim 1, wherein the connection region is vertically slanted.

6. The copper strap according to claim 1, wherein the connection region is vertically curved.

7. The copper strap according to claim 1, wherein the copper strap is made of oxygen-free high conductivity copper.

8. The copper strap according to claim 1, wherein the contact further comprises a first plane and a depression region, the depression region having a second plane, and wherein the second plane is positioned below the first plane.

9. The copper strap according to claim 1, wherein the leg portion further comprises a curved bottom surface.

10. A power semiconductor package, comprising:
    a lead frame having at least one first terminal extending therefrom;
    a die pad;
    a power semiconductor die surface mounted to the die pad, the power semiconductor die further comprising at least one die electrode; and
    a copper strap having a contact electrically connectable to the at least one die electrode, a leg portion electrically connected to the lead frame, a web portion positioned between the contact and the leg portion and connected to the leg portion; and
    a connection region connecting the web to the contact, wherein the contact comprises a body having a plurality of formations, each of the plurality of formations having a concavity and an opposing convexity positioned to generally face the at least one die electrode.

11. The power semiconductor package according to claim 10, wherein the web portion of the copper strap further comprises a through hole configured to allow flow of a molding compound therethrough.

12. The power semiconductor package according to claim 10, wherein the each formation of the contact body is a generally round depression.

13. The power semiconductor package according to claim 10, wherein the each formation of the contact body is an elongated groove extending from one edge of the contact to another edge thereof.

14. The power semiconductor package according to claim 10, wherein the connection region is vertically slanted.

15. The power semiconductor package according to claim 10, wherein the connection region is vertically curved.

16. The power semiconductor package according to claim 10, wherein the copper strap is made of oxygen-free high conductivity copper.

17. The power semiconductor package according to claim 10, wherein the contact further comprises a first plane and a depression region, the depression region having a second plane, and wherein the second plane is positioned below the first plane.

18. The power semiconductor package according to claim 10, wherein the leg portion further comprises a curved bottom surface.

19. A copper strap for a semiconductor device package comprising:
 a contact electrically connectable to a die electrode, the contact including a plurality of pockets formed on the underside of the contact positioned to generally face the electrode;
 a leg portion electrically connected to a lead frame;
 a web portion positioned between the contact and the leg portion and connected to the leg portion; and
 a connection region connecting the web to the contact.

20. The copper strap according to claim 19, wherein the plurality of pockets comprise grooved pockets formed between grooves that extend outward from the underside of the contact.

21. The copper strap according to claim 19, wherein the plurality of pockets comprise dimpled pockets formed between dimples that extend outward from the underside of the contact.

22. The copper strap according to claim 19, wherein the contact further comprises a plurality of formations in the body thereof, each of the plurality of formations having a concavity and an opposing convexity positioned to generally face the electrode.

* * * * *